(12) United States Patent
Hsia et al.

(10) Patent No.: US 6,771,545 B1
(45) Date of Patent: Aug. 3, 2004

(54) METHOD FOR READING A NON-VOLATILE MEMORY CELL ADJACENT TO AN INACTIVE REGION OF A NON-VOLATILE MEMORY CELL ARRAY

(75) Inventors: Edward Hsia, Saratoga, CA (US); Eric Ajimine, Saratoga, CA (US); Darlene G. Hamilton, San Jose, CA (US); Pauling Chen, Saratoga, CA (US); Ming-Huei Shieh, Cupertino, CA (US); Mark W. Randolph, San Jose, CA (US); Edward Runnion, Santa Clara, CA (US); Yi He, Fremont, CA (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 38 days.

(21) Appl. No.: 10/353,558

(22) Filed: Jan. 29, 2003

(51) Int. Cl.[7] .............................................. G11C 16/04
(52) U.S. Cl. ............................. 365/185.29; 365/185.3; 365/185.11
(58) Field of Search ......................... 365/185.29, 185.3, 365/185.11

(56) References Cited

U.S. PATENT DOCUMENTS 6,278,635 B1 * 8/2001 Hara ........................ 365/185.3
6,335,882 B1 * 1/2002 Saeki et al. ............. 365/185.29

* cited by examiner

Primary Examiner—Huan Hoang
(74) Attorney, Agent, or Firm—Renner, Otto, Boisselle & Sklar, LLP (57) ABSTRACT

An array of non-volatile memory cells includes active columns of cells wherein a data pattern may be stored adjacent to damaged or inactive columns wherein data is not stored. A method of storing a data pattern and reproducing the data pattern within such an array comprises storing a charge within a selected plurality of the memory cells within the active column. The selected plurality of memory cells represents a portion of the data pattern. An inactive memory cell programming pattern is identified. The inactive memory cell programming pattern identifies all, or a selected plurality, of the memory cells in the inactive column in which a charge is to be stored for the purpose of periodically storing a charge in the memory cells first inactive column to prevent over erasure, during bulk erase, and leakage from the inactive cells to adjacent active cells. A charge is stored on the selected plurality of the memory cells in the first inactive column. The data pattern is reproduced reading each memory cell within the first active column.

18 Claims, 5 Drawing Sheets

| Cell ID | 45c | | 45f | | 45d,45e | |
|---|---|---|---|---|---|---|
| | 62 | 64 | 62 | 64 | 62 | 64 |
| 48a | P | P | P | P | — | — |
| 48b | P | P | P | P | — | — |
| 48c | P | P | P | P | — | — |
| · | P | P | P | P | — | — |
| · | P | P | P | P | — | — |
| · | P | P | P | P | — | — |
| 48n | P | P | P | P | — | — |

101 →

| 45d,45e | |
|---|---|
| 62 | 64 |
| P | P |
| P | P |
| P | P |
| P | P |
| P | P |
| P | P |
| P | P |

| Cell ID | 45c | | 45f | | 45d,45e | |
|---|---|---|---|---|---|---|
| | P | — | — | P | — | — |
| 48a | P | — | — | P | — | — |
| 48b | P | — | — | P | — | — |
| 48c | P | — | — | P | — | — |
| · | P | — | — | P | — | — |
| · | P | — | — | P | — | — |
| · | P | — | — | P | — | — |
| 48n | P | — | — | P | — | — |

METHOD FOR READING A NON-VOLATILE MEMORY CELL ADJACENT TO AN INACTIVE REGION OF A NON-VOLATILE MEMORY CELL ARRAY

TECHNICAL FIELD

The present invention relates generally to flash memory cell devices and more specifically, to improvements in systems and methods for reading a charge previously stored in a column of charge trapping dielectric flash memory cells that is adjacent to an inactive column.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate is a channel region, positioned below the vertical stack, and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate disburses across the semi conductive gate and has the effect of increasing the threshold voltage of the FET characterized by the source region, drain region, channel region, and control gate. During a "read" of the memory cell, the programmed, or non-programmed, state of the memory cell can be detected by detecting the magnitude of the current flowing between the source and drain at a predetermined control gate voltage.

More recently charge trapping dielectric flash memory cell structures have been developed. Each charge trapping dielectric flash memory cell is characterized by a vertical stack of an insulating tunnel layer, a charge trapping dielectric layer, an insulating top oxide layer, and a polysilicon control gate positioned on top of a crystalline silicon substrate.

The cells within the array may be arranged in a matrix such that bit lines are shared by cells within a column, and word lines are shared by cells within a row. More specifically, within the substrate is a channel region associated with each memory cell that is positioned below the vertical stack. One of a plurality of bit line diffusions separates each channel region from an adjacent channel region. The bit line diffusions form the source region and drain region of each cell. Each polysilicon control gate may be a portion of a polysilicon word line extending over the insulating top oxide layer of all cells such that all of the control gates are electrically coupled.

Similar to the floating gate device, the charge trapping dielectric flash memory cell is programmed by inducing hot electron injection from the channel region to the nitride layer to create a non volatile negative charge within charge traps existing in the nitride layer. Again, hot electron injection can be achieved by applying a drain-to-source bias along with a high positive voltage on the control gate. The high voltage on the control gate inverts the channel region while the drain-to-source bias accelerates electrons towards the drain region. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain region, those electrons which collide with the crystalline lattice are re-directed towards the Si—$SiO_2$ interface under the influence of the control gate electrical field and have sufficient energy to cross the barrier. Because the nitride layer stores the injected electrons within traps and is otherwise a dielectric, the trapped electrons remain localized within a drain charge storage region that is close to the drain region.

Similarly, a source-to-drain bias may be applied along with a high positive voltage on the control gate to inject hot electrons into a source charge storage region that is close to the source region. For example, grounding the drain region in the presence of a high voltage on the gate and the source region may be used to inject electrons into the source bit charge storage region.

As such, the charge trapping dielectric flash memory cell device can be used to store two bits of data, one in each of the source charge storage region (referred to as the source bit) and the charge storage region (referred to as the drain bit).

Due to the fact that the charge stored in the storage region only increases the threshold voltage in the portion of the channel region beneath the storage region, each of the source bit and the drain bit can be read independently by detecting channel inversion in the region of the channel region beneath each of the source storage region and the drain storage region. To "read" the drain bit, the drain region is grounded while a voltage is applied to the source region and a slightly higher voltage is applied to the gate. As such, the portion of the channel region near the source/channel junction will not invert (because the gate voltage with respect to the source region voltage is insufficient to invert the channel) and current flow at the drain/channel junction can be used to detect the change in threshold voltage caused by the programmed state of the drain bit.

Similarly, to "read" the source bit, the source region is grounded while a voltage is applied to the drain region and a slightly higher voltage is applied to the gate. As such, the portion of the channel region near the drain/channel junction will not invert and current flow at the source/channel junction can be used to detect the change in threshold voltage caused by the programmed state of the source bit.

Figure 1:
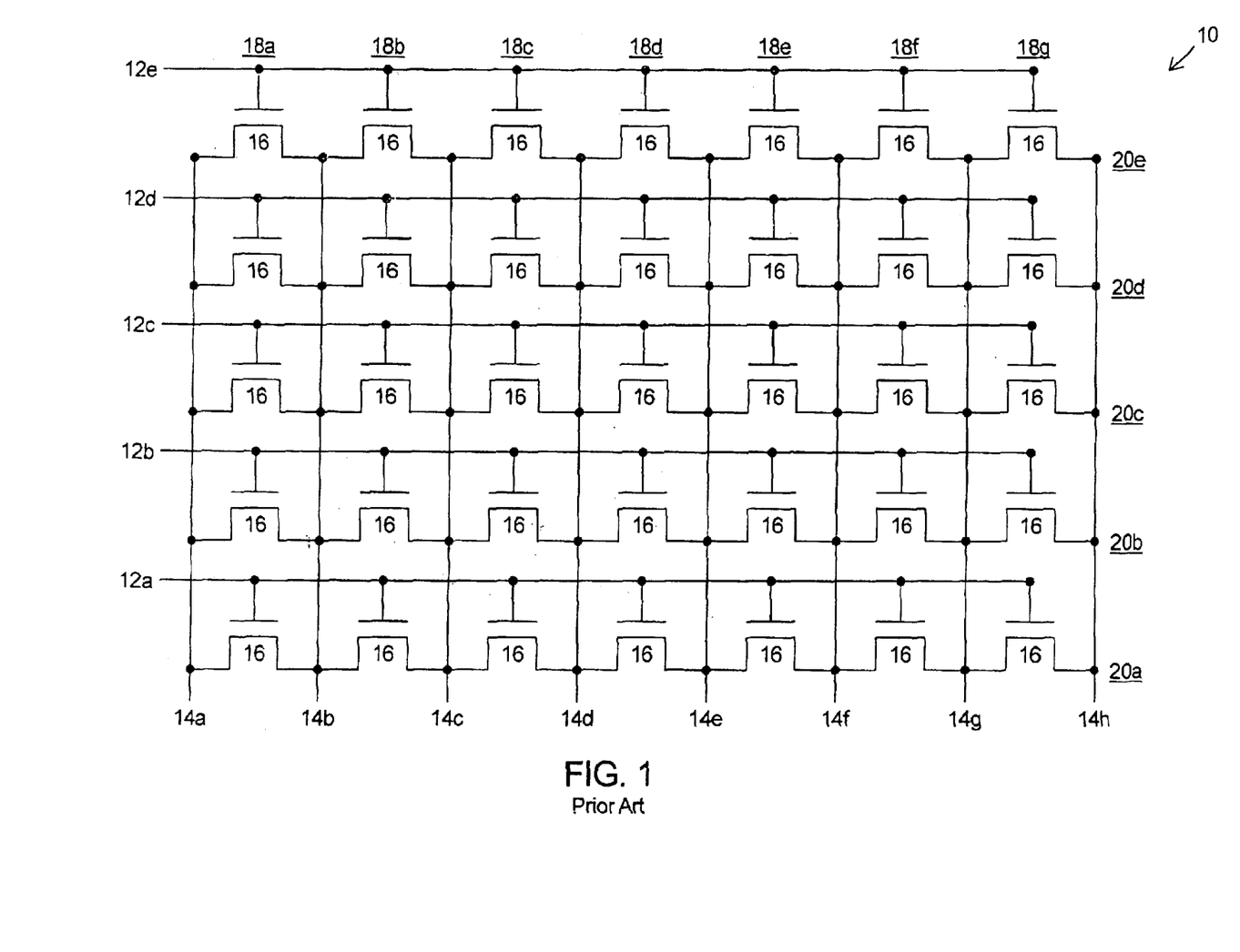
FIG. 1 is a schematic, cross sectional view of a charge trapping dielectric memory flash cell array known in the prior art.

FIG. 1 shows a block diagram of a conventional array of charge trapping dielectric flash memory cells 16. Each pair of adjacent bit line diffusions 14a–14h form a source region and a drain region for each cell 16 within the column of cells 18 defined by such pair of adjacent bit lines 14. Each word line 12a–12e forms a semiconductor control gate over each cell 16 within the row 20a–20e of cells 16 that are defined by such word line 12.

The above described programming and reading of each charge trapping region of each cell 16 within the array 10 may be accomplish by applying appropriate programming voltage potentials and appropriate read voltage potentials to each bit line diffusion 14a–14h and each word line 12a–12e to individually program and read selected cells 16.

Erasing a programmed charge within a cell 16 is performed by coupling bulk erase voltage potentials to each bit line diffusion 14a–14h and each word line 12a–12e to bulk erase all cells 16 within the array 10 simultaneously. Bulk erase techniques using hot hole injection or the tunneling of the stored charge into the gate or the substrate are known in the art.

A problem associated with such conventional arrays is that certain columns may be inactive. For example, if testing of the array 10 indicates that cells within the columns 18b–18d do not operate properly, array control circuits may inactivate such columns 18b–18d such that no data is programmed to the cells therein.

A problem associated with inactive columns is over-erasure. While the cells within the inactive columns are not programmed and read, those cells due undergo erasure each time a bulk erase is performed on the array. Multiple sequential erase cycles can cause depletion in the charge storage region thereby lowering the threshold voltage of the cell even in its erased (un-programmed) state.

As such, when the word line associated with the over-erased cell is coupled to a read potential for reading a selected cell in a column adjacent to the inactive column, current leakage through the over-erased cell may cause mis-reading of the selected cell.

What is needed is an array system and method for operating an array of memory cells, which includes inactive columns, which does not suffer the disadvantages of known systems.

SUMMARY OF THE INVENTION

A first aspect of the present invention is to provide an array of non-volatile memory cells for storing a data pattern and reproducing the data pattern. The array comprises: a) a semiconductor substrate; b) a plurality of parallel and spaced apart bit line diffusions within the substrate defining a plurality of vertical channel regions spaced there between; c) a plurality of parallel spaced apart semiconductor word lines positioned over the substrate and separated from the substrate by an insulator film, a charge trapping layer, and a second insulator film, the word lines being perpendicular to the bit line diffusions and forming a memory cell at each intersection of a word line and a channel region; d) circuits for determining an inactive memory cell programming pattern; and e) an array control circuit coupled to each bit line diffusion and coupled to each word line.

Within the array, a block of inactive columns of memory cells may include a first inactive column and a second inactive column, both of which may be adjacent to, and share a bit line with, a first active column of memory cells and a second active column of memory cells. Between the first inactive column and the second inactive column there maybe one for more additional inactive columns.

The inactive memory cell programming pattern may identify a selected plurality of the memory cells within the first inactive column, the second inactive column, and the one or more additional inactive columns, in which a charge is to be stored for the purpose of periodically storing a charge in the source charge trapping region and the drain charge trapping region of the memory cells to prevent over erasure.

The inactive memory cell programming pattern preferably identifies all cells within the first inactive column and the second inactive column. Alternatively, the inactive memory cell programming pattern may be a pattern sequentially selected from a plurality of inactive programming patterns. The plurality of inactive programming patterns, in sequence, provide for storing a charge on each charge trapping region of each memory cell within the first inactive column and the second inactive column at least once prior to performing a predetermined number of sequential erase cycles. In either embodiment, the programming pattern may identify a selected plurality of memory cells within the at least one additional inactive column.

The array control circuit may comprise programming circuits, reading circuits and erase circuits. The programming circuits provide for coupling each bit line diffusion and each word line to programming potentials for storing a charge within a selected plurality of the memory cells within the first active column and within the second active column. The selected plurality of memory cells represents a portion of a data pattern. The programming circuit also provides for coupling each bit line diffusion and each word line to programming potentials for storing a charge within a selected plurality of the memory cells within the first inactive column, within the second inactive column, and/or within the at least one additional inactive column that represents an inactive memory cell programming pattern to prevent over-erasure of cells within such inactive columns.

The reading circuits provide for coupling each bit line diffusion and each word line to programming potentials for reproducing the portion of the input data pattern by reading each memory cell within the first active column and/or within the second active column.

The erase circuits provide for coupling all memory cells of all columns (e.g. the first active column, the second active column, the first inactive column, the second inactive column, and the at least one additional inactive column) to erase voltage potentials that provide for removing a stored charge.

A second aspect of the present invention is to provide a method of storing a data pattern and reproducing the data pattern within an array of non-volatile memory cells. Within the array, a block of inactive columns of memory cells may include a first inactive column and a second inactive column, both of which may be adjacent to, and share a bit line with, a first active column and a second active column. Between the first inactive column and the second inactive column there maybe one for more additional inactive columns.

The method comprises storing a charge within a selected plurality of the memory cells within the first active column and/or the second active column. The selected plurality of memory cells represents a portion of the data pattern. The portion of the data pattern is reproduced by reading each memory cell within the first active column and/or the second active column.

Erasing of the memory cells within the array again comprises coupling all memory cells to voltage potentials that provide for removing a stored charge from each memory cell.

To prevent over-erasure of memory cells within the first inactive column and/or the second inactive column, the method may further comprises determining an inactive memory cell programming pattern and programming all or selected memory cells within at least one of the first inactive column, the second inactive column, and the at least one additional inactive column in accordance therewith. The inactive memory cell programming pattern may identify a selected plurality of the memory cells in such columns in which a charge is to be stored for the purpose of periodically storing a charge to prevent over erasure. The inactive memory cell programming pattern may be a pattern that provides for storing a charge on all of the memory cells within such columns. Alternatively, the inactive memory cell programming pattern may be a pattern sequentially selected from a plurality of inactive programming patterns. The plurality of inactive programming patterns, in sequence, provide for storing a charge on each source charge trapping region and each drain charge trapping region of each memory cell within such columns at least once prior to performing a predetermined number of sequential erase cycles.

For a better understanding of the present invention, together with other and further aspects thereof, reference is made to the following description, taken in conjunction with the accompanying drawings. The scope of the invention is set forth in the appended clams.

DESCRIPTION OF THE PREFERRED EMBODIMENTS

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

Figure 2:
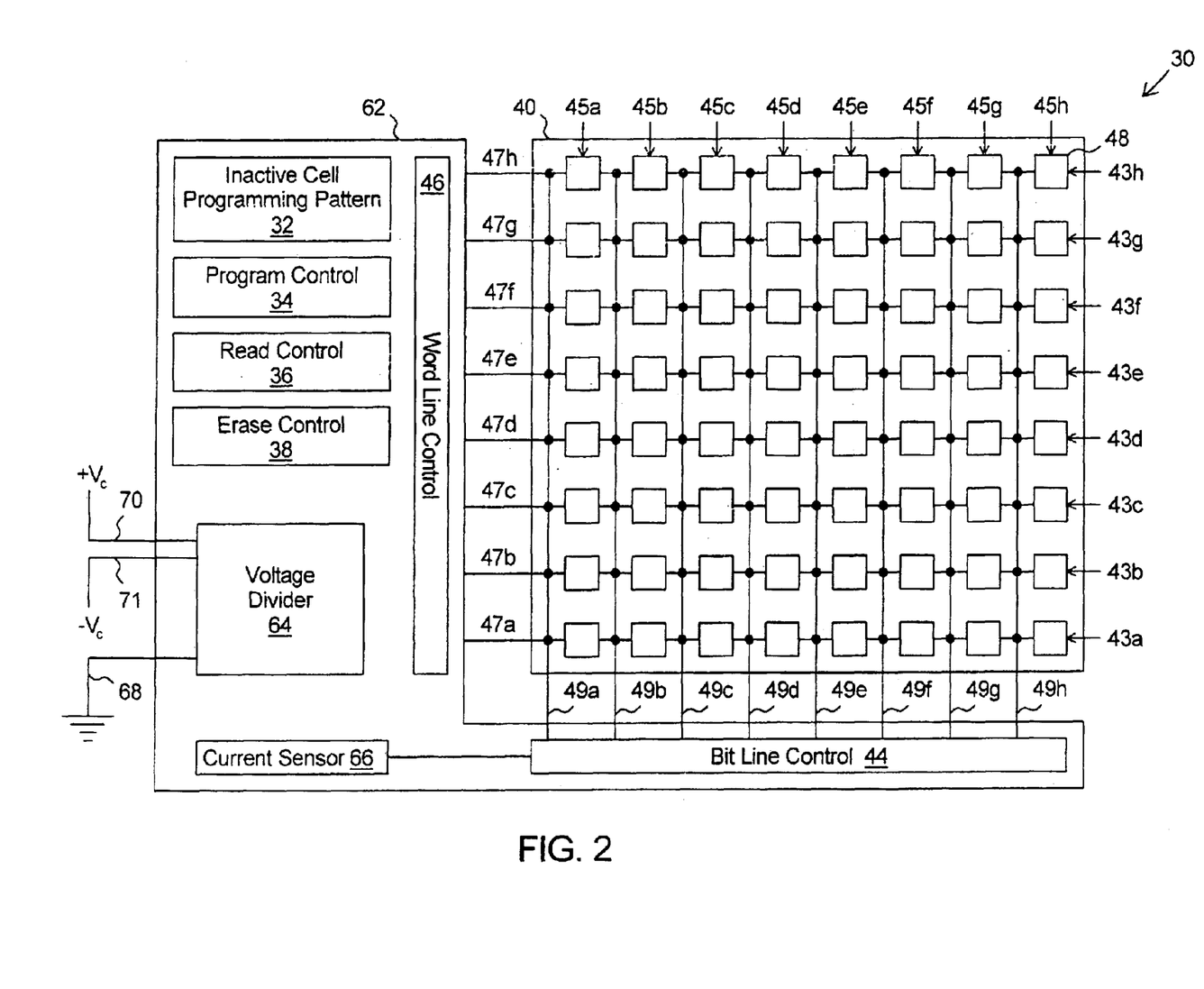
FIG. 2 is a schematic, block diagram view of a charge trapping dielectric flash memory cell array in accordance with one embodiment of the present invention.

FIG. 2 shows an exemplary embodiment of a non-volatile charge trapping dielectric flash memory cell system 30 in block diagram form. The system 30 comprises an array 40 of non-volatile charge trapping memory cells 48 and an array control circuit 62 fabricated on a crystalline semiconductor substrate.

Figure 3:
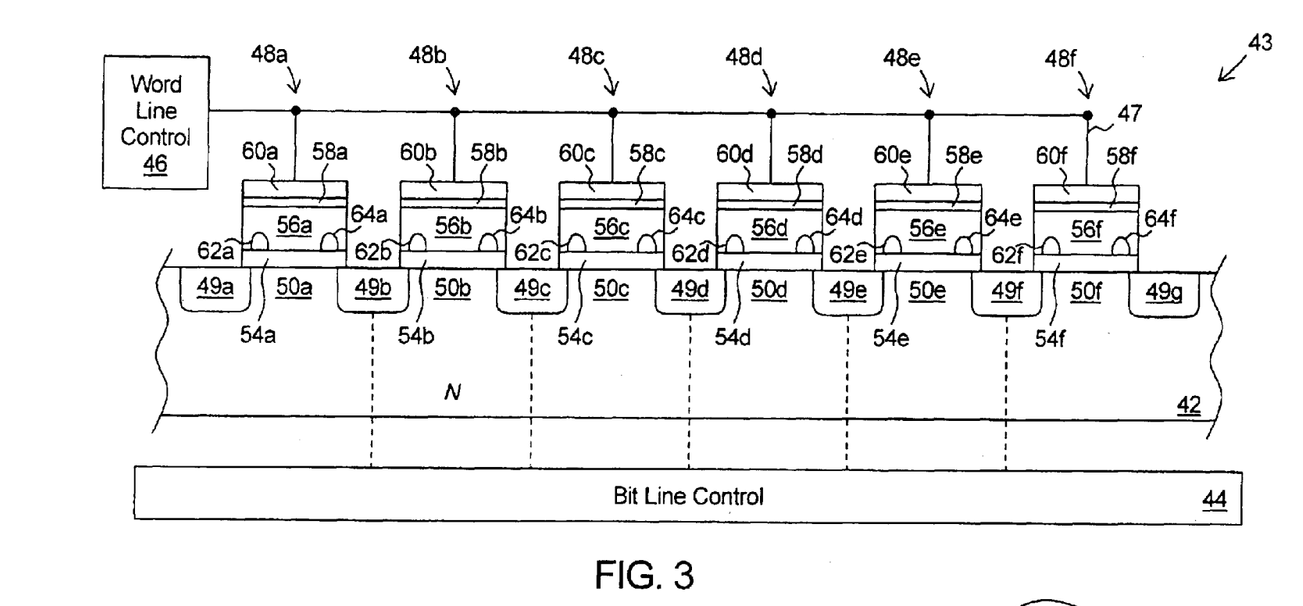
FIG. 3 is a schematic, cross sectional view of the charge trapping dielectric flash memory cell array of FIG. 2.

The array 40 of non-volatile charge trapping dielectric flash memory cells 48 is arranged in a matrix format with the memory cells 48 arranged in vertical columns 45a–45h and perpendicular horizontal rows 43a–43h. Each memory cell 48 within a column 45 shares the same channel region and the two bit line diffusions 49 with the other memory cells 48 that are in the same column 45. The two bit lines 49 are adjacent to and form a junction with the channel region 50 (FIG. 3). Each memory cell 48 within a row 43 shares the same semiconductor word line 47, or gate, with other memory cells 48 that are in the same row 43.

FIG. 3 represents a cross section diagram of a single row 43 of non-volatile memory cells 48 which share a common word line 47. Turning to FIG. 3 in conjunction with the FIG. 2, it should be appreciated that the polysilicon word line 47 is structured to form a control gate 60 over each memory cell 48 within the row 43. Each bit line diffusion 49 is of opposite semiconductor conductivity as the channel region 50 such that each bit line diffusion 49 forms a semiconductor junction with the two channel regions 50 between which the bit line diffusion 49 is positioned. Each bit line diffusion 49 forms a source region and/or a drain region for each cell in the two columns 45 that are defined by the two channel regions 50 that are adjacent to the bit line diffusion 49. For example, bit line diffusion 49c forms a junction with each of channel regions 50b and 50c of columns 45b and 45c respectively. In the exemplary embodiment, each memory cell 48 is an n-mos device. As such, each channel region 50 is a p-type semiconductor such as crystalline silicon lightly implanted with a hole donor impurity such boron and each bit line diffusion 49 is an n-type semiconductor such as crystalline silicon implanted with an electron donor impurity such as arsenic.

With respect to each memory cell 48, above the channel region 50 is a first insulating barrier, or tunnel layer, 54 which may comprise silicon dioxide. The thickness of the tunnel layer 54 may be within a range of about 50 to about 150 angstroms. An embodiment with a more narrow bracket includes a tunnel layer 54 thickness within a range of about 60 to about 90 angstroms and even narrower yet, a tunnel layer 54 with a thickness of about 70 to about 80 angstroms.

Above the tunnel layer is a charge trapping layer 56 that includes both a source charge trapping region or source bit 62 and a drain charge trapping region or drain bit 64 each for storing a neutral charge representing an un-programmed state or a negative charge representing a programmed state. The charge trapping layer 56 may comprise a nitride compound with suitable charge trapping properties and may have a thickness on the order of 20 to 100 angstroms. In the exemplary embodiment, the nitride compound may be selected from the group consisting of $Si_2N_4$, $Si_3N_4$ and $SiO_xN_4$.

Above the charge trapping layer 56 is a top dielectric layer 58. The top dielectric layer 58 may be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrSi_xO_y$ and other materials with similarly high dielectric constants. If the top dielectric layer 58 is silicon dioxide, the layer 58 may have a thickness on the order of 60 to 100 angstroms. Alternatively, if the top dielectric layer 58 is a high K material, its electrical thickness may be on the order of 60 to 100 angstroms while its physical thickness may be within a range of about 70 to 130 angstroms. An embodiment with a more narrow bracket includes a top dielectric layer 58 with a thickness within a range of about 80 to about 120 angstroms and even narrower yet, a top dielectric layer 58 with a thickness of about 90 to about 100 angstroms.

Above the top dielectric layer 58 is the word-line 47 that forms a gate 60 over each memory cell 48 within the row 43. In the exemplary embodiment, the gate 60 may comprise polysilicon with a thickness on the order of 4,000 angstroms. The word-line 47 is coupled to the word line control circuit 46.

Returning again to FIG. 2, the array control circuit 62 comprises a word line control circuit 46, a bit line control circuit 44, a current sensor circuit 66, an inactive cell programming pattern generator circuit 32, a cell program control circuit 34, a cell read control circuit 36, an array erase control circuit 38, a voltage divider circuit 64, a coupling to a positive operating power source (Vc) 70, a coupling to a negative operating power source (−Vc) 71, and a coupling to a ground 68.

As previously discussed, certain columns within the array may be inactive due to inadequate data retention or inadequate operation. Also as previously discussed, sequential erasure of cells within inactive columns can lead to over-erasure and current leakage between the two bit lines when the cell's gate is biased high for selectively reading an active cell in an active column that shares the same word line with the inactive cell.

Disclosure of Exemplary Inactive Memory Cell Programming Patterns

The inactive cell programming pattern generator 32 generates an inactive memory cell programming pattern that may be used by the program control circuit 34 for the purpose of periodically programming (e.g. storing a charge in) each source charge trapping region 62 and each drain charge trapping region 64 of a memory cell 48 (or the single charge trapping region if the memory cell 48 is a single bit memory cell) of an inactive column to prevent over-erasure.

In a simple embodiment, the inactive memory cell programming pattern simply identifies each source charge trapping region 62 and each drain charge trapping region 64 of each cell in at least the two inactive columns (of an inactive column block) that boarder active columns. As such, the program control circuit 34 will program each cell between each erase cycle. For example, if columns 45c, 45d, 45e, and 45f are inactive columns, inactive columns 45c and 45f each boarder active columns 45b and 45g respectively. As such, column 45c may be called a first inactive column 45c; column 45f may be called a second inactive column 45f; and columns 45d and 45e may be called center inactive columns 45d, 45e.

Figure 5A:
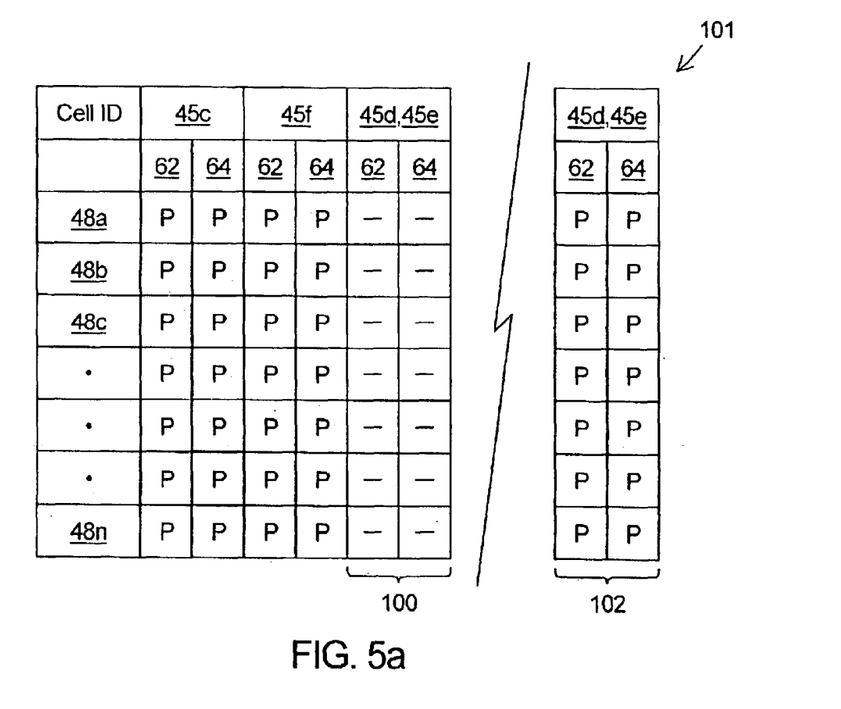
FIG. 5a is a table representing a first exemplary inactive memory cell programming pattern in accordance with this invention.

The table of FIG. 5a represents the simple inactive memory cell programming pattern 101 for inactive memory cell columns. Referring to FIG. 5a in conjunction with FIGS. 2 and 3, the example inactive memory cell columns include columns 45c–45f. Columns 45c is the first inactive column boarding an active column 45b, 45f is the second inactive column boarding active column 45g, and each of columns 45d and 45e are center inactive columns.

Each cell 48a–48n in the first inactive column 45c and each cell 48a–48n in the second inactive column 45f is included in the inactive memory cell programming pattern 101 as indicated by the "p" in each of sub column 62 (representing the source charge trapping region 62) and sub column 64 (representing the drain charge trapping region 64). Such inactive memory cell programming pattern 101 is applied to program each memory cell 48 within the first and second inactive columns 45c and 45f prior to executing an erase cycle to prevent depletion of such inactive cells and current leakage during a read cycle.

In a first sub embodiment 100, cells 48 within the center inactive columns 45d, 45e are not included in the pattern 101 and thus are not programmed prior to an erase cycle.

In a second sub embodiment 102, each cell 48a–48n within the center inactive columns 45d, 45e are included in the pattern 101 and thus are programmed prior to an erase cycle. It should be appreciated that the center inactive columns 45d, 45e may be programmed or pre-conditioned to any pattern. It should also be appreciated that the center inactive columns 45d, 45e may be logically isolated from the active columns and the first and second inactive columns 45c and 45f such that programming and erasure of the center inactive columns 45d, 45e is independent of program and erasure cycles of the active columns and the first and second inactive columns 45c and 45f. More specifically, the logic access path for the center inactive columns 45e, 45e may be separate from the logic access path for the active columns and the first and second inactive columns 45c and 45f.

Figure 5B:
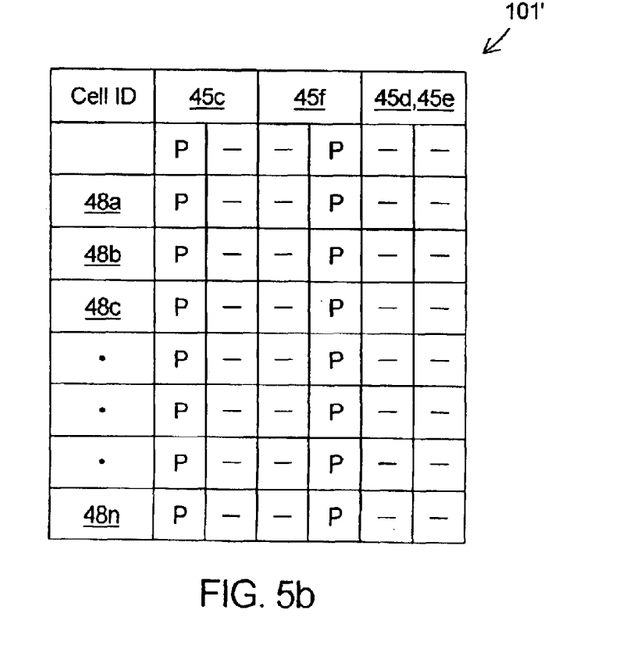
FIG. 5b is table representing a second exemplary inactive memory cell programming pattern in accordance with this invention.

FIG. 5b represents an alternative embodiment of an inactive memory cell programming pattern 101'. The programming pattern 101' is similar to the pattern 101 discussed with respect to FIG. 5a, except that only the source charge trapping region 62 or the drain charge trapping region 64 that is directly adjacent to an active column is included within the pattern 101' and thus programmed prior to an erase cycle.

For example, source charge trapping region 62 of the first inactive column 45c is adjacent to active column 45b. Therefore the source charge trapping region 62 of the first inactive column 45c is included within pattern 101' as represented by the "p" in such column while the drain charge trapping region 64 is not included within pattern 101'.

Similarly, the drain charge trapping region 64 of the second inactive column 45f is adjacent to active column 45g. Therefore the drain charge trapping region 64 of the second inactive column 45f is included within pattern 101' while the source charge trapping region 62 is not included within pattern 101'.

Disclosure of Alternative Inactive Memory Cell Programming Patterns

The preferable system for practicing the present invention, as discussed above, includes programming all memory cells within an inactive column that boarders an active column to prevent current leakage through any cells within the inactive column during a read of cells within the active column. However, it is envisioned that a less optimal method of achieving the results of the present invention would be to cycle the programming of cells within the inactive columns such that each inactive cell within an inactive column is programmed every two erase cycles or every three erase cycles. Therefore, the inactive memory cell programming patterns of FIGS. 6a and 6b, while possibly not the most optimal programming patterns, are envisioned within the scope of the invention.

Figure 6A:
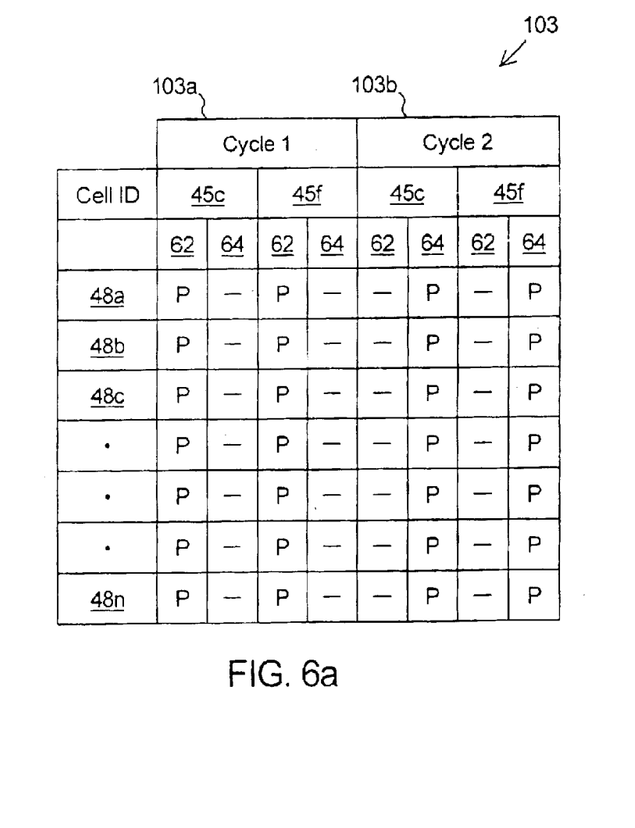
FIG. 6a is table representing a first alternative inactive memory cell programming pattern in accordance with this invention.

The table of FIG. 6a represents an alternative embodiment of an inactive memory cell programming pattern 103. The programming pattern 103 comprises a first programming pattern, or first cycle, 103a and a second programming pattern, or second cycle, 103b. Programming of inactive memory cells is alternated between pattern 103a and pattern 103b.

Each source charge trapping region 62 of each memory cell 48a–48n of both the first inactive column 45c and the second inactive column 45f is included in the first cycle 103a. Each drain charge trapping region of each memory cell 48a–48n of both the first inactive column 45c and the second inactive column 45f is included in the second cycle 103b. A similar two cycle pattern may be implemented in the center inactive columns 45d, 45e.

Figure 6B:
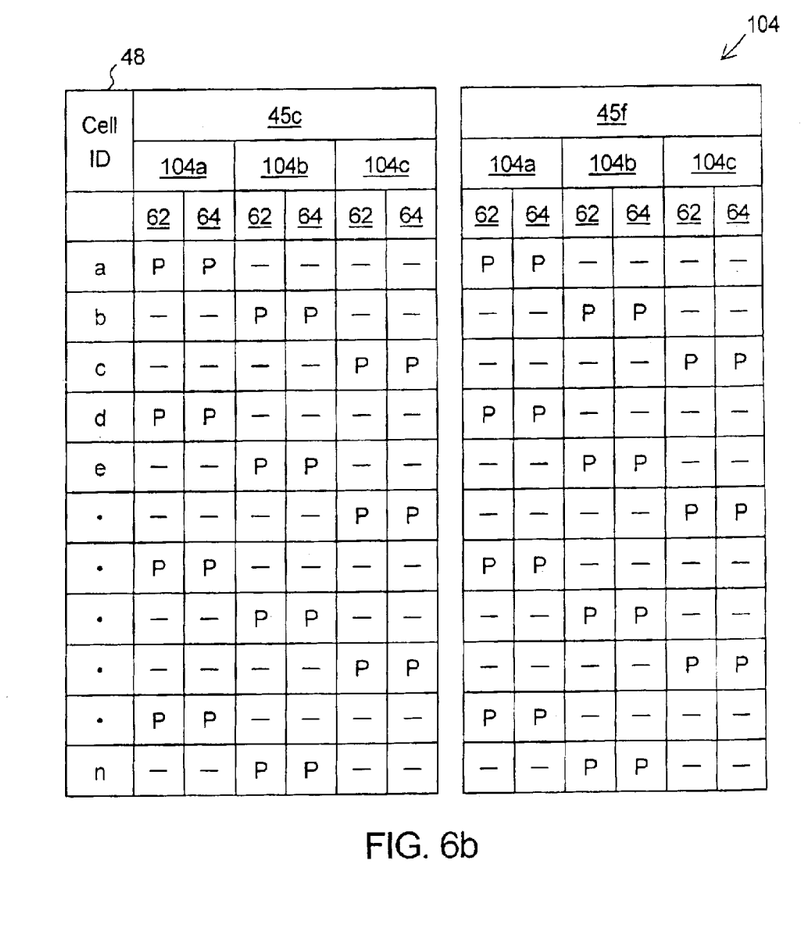
FIG. 6b is a table representing a second alternative inactive memory cell programming pattern in accordance with this invention.

A second alternative and even more complex embodiment of an inactive memory cell programming pattern 104 is shown in FIG. 6b. The programming pattern 104 comprises three sequentially alternating programming patterns, or cycles, 104a, 104b, and 104c such that only one third of the cells 48a–48n within an inactive column are programmed between each erase cycle, but all cells 48a–48n in each inactive column go through a program cycle prior to being subject to three sequential erase cycles. More specifically, each cell 48a–48n in the first inactive column 45c is identified for programming in only one of three cell groups 104a, 104b, and 104c. Only one cell group (selected in an alternating order) is programmed between sequential erase cycles. The same system is applied to the second inactive active column 45f and may be applied to the center inactive columns 45d, 45e.

With both such alternative embodiments, the center inactive columns may be programmed or preconditioned to any pattern and the center inactive columns may be logically isolated, on a separate logic access paths, from the active columns and the first and second inactive columns such that programming and erasure of the center inactive columns is independent of program and erasure cycles of the active columns and the first and second inactive columns.

Returning to FIGS. 2 and 3, the word line control circuit 46 selectively couples each word line 47a–47h to a voltage provided by the voltage divider 64 (or to ground 68) in accordance with signals provided by the program control circuit 34, the read control circuit 36, and the erase control circuit 38. The signals provide for selectively programming, selectively reading, and bulk erasing memory cells 48 within the array 40 respectively.

The bit line control circuit 44 selectively couples each bit line diffusion 49a–49h to a voltage provided by the voltage divider 64 or to the current sensor circuit 66 in accordance with signals provided by the program control circuit 34, the read control circuit 36, and the erase control circuit 38. Again, the signals provide for selectively programming, selectively reading, and bulk erasing memory cells 48 within the array 40 respectively.

The current sensor 66 may utilize known circuits for sensing current on the selected bit line that is coupled to the current sensor 66 by the bit line control circuit 44. The current sensed represents the programmed state of a selected one of a source charge trapping region 62 or a drain charge trapping region 64 when applicable potentials are coupled to applicable word lines 47 and bit lines 49 by the array control circuit 62 for reading the selected charge trapping region as described in more detail herein.

Figure 4:
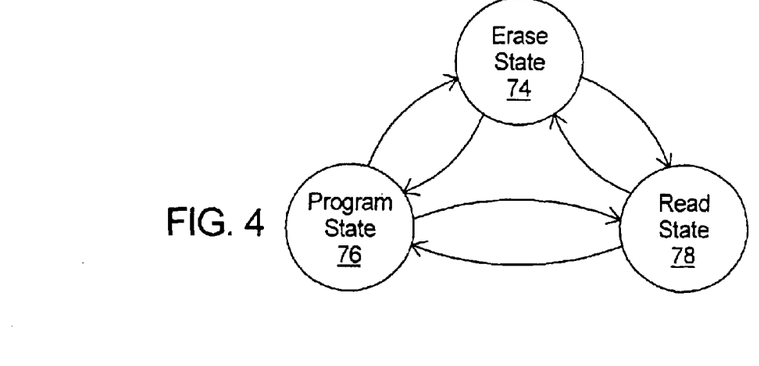
FIG. 4 is a state machine diagram representing exemplary operation of an array control circuit.

Turning briefly to FIG. 4 in conjunction with FIG. 2 and FIG. 3, the array control circuit 62 operates in three states, a program state 76 where in charge is selectively stored into the source charge trapping region 62 or the drain charge trapping region 64 of a selected one of the memory cells 48, a read state 78 wherein a stored charge is detected from the source charge trapping region 62 or the drain charge trapping region 62 of a selected one of the memory cells 48 to reproduce data originally stored in such charge trapping region, and an erase state 78 wherein charge stored in charge trapping regions 62 and 64 of one or more memory cells 48 is removed prior to reprogramming in the program state 76.

When in the program state 76, the program control circuit 45 controls operation of the word line control circuit 46 and the bit line control circuit 44 such that selective voltages are coupled to each word line 47 and each bit line 49 to selectively program each memory cell 48 within at least one active column 48 in accordance with data to be stored in the array 40 and selectively programs each memory cell 48 within at least one inactive column in accordance with the inactive memory cell programming pattern provided by the inactive memory cell programming pattern circuit 32.

Within a memory cell 48 selected to be programmed, the source charge trapping region 62 is programmed by injecting electrons into the source charge trapping region 62 using a hot electron injection technique. More specifically, the program control circuit 45 provides for the array control circuit 62 to couple the bit lines 49 and the word lines 47 to various potentials (provided by the voltage divider 64) to apply a high source-to-drain bias while applying a high voltage to the control gate. For example, referring to cell 48b, this may be accomplished by the bit line control circuit 44 coupling the bit line 49c, which represents the drain region of cell 48b, to ground and coupling the bit line 49b, which represents the source region of cell 48b, to a approximately 5 volts. Simultaneously, word line control circuit 46 couples the selected word line 47, representing the control gate 60 of the cell 48b, to approximately 10 volts while coupling non-selected word lines (e.g. the word lines other than the selected word line) to ground or to a small negative voltage to prevent punch-through current leakage through non-selected memory cells that share the same column as the selected memory cell 48b. The voltage on the control gate 60 inverts the channel region 50b while the high source-to-drain bias draws and accelerates electrons from the drain region 49c into the channel region 50b towards the source region 49b.

The 4.5 eV to 5 eV kinetic energy gain of the electrons is more than sufficient to surmount the 3.1 eV to 3.5 eV energy barrier at channel region 50b/tunnel layer 54b interface and, while the electrons are accelerated towards source region 49b, the field caused by the high voltage on control gate 60b redirects the electrons towards the source charge trapping region 62b. Those electrons that cross the interface into the source charge trapping region 62b remain trapped within the charge trapping layer 56b for later reading.

Similarly, the drain charge trapping region 64 is programmed by injecting electrons into the drain charge trapping region 64 using a hot electron injection technique. More specifically, the array control circuit 62 couples the bit lines 49 and the word lines 47 to various potentials to apply a high drain-to-source bias while applying a high voltage to the control gate 60. For example, referring again to cell 48b, this may be accomplished by the bit line control circuit 44 coupling the bit line 49b, which represents the source region of cell 48b, to ground and coupling the bit line 49c, which represents the drain region of cell 48b, to approximately 5 volts. Simultaneously, the word line control circuit 46 couples the selected word line 47, representing the control gate 60, to approximately 10 volts while coupling the non-selected word lines to either ground or a small negative voltage. Again, the voltage on the control gate 60 inverts the channel region 50b while the high drain-to-source bias draws and accelerates electrons from the source region 49b into the channel region 50b towards the drain region 49c.

Again, the 4.5 eV to 5 eV kinetic energy gain of the electrons is more than sufficient to surmount the 3.1 eV to 3.5 eV energy barrier at channel region 52b/tunnel layer 54b interface and, while the electrons are accelerated towards drain region 52c, the field caused by the high voltage on control gate 60b redirects the electrons towards the drain charge trapping region 64b.

When in the erase state 74, the erase control circuit 48 controls operation of the word line control circuit 46 and the bit line control circuit 44 such that selective voltages are coupled to each word line 47 and each bit line 49 to erase each memory cell 48 within the array 40. The erase control circuit 48 may provide for the bit line control circuit 44 (and the word line control circuit 46) to couple the bit lines 49

(and the word lines 47) to applicable potentials such that the source charge trapping region 62 and the drain charge trapping region 64 of multiple cells are erased using either a hot hole injection technique or by tunneling the electrons from the charge trapping layer 56 to the gate 60 or the substrate 42. Both techniques are known in the art.

When in the read state 78, the read control circuit 36 controls operation of the word line control circuit 46 and the bit line control circuit 44 such that selective voltages are coupled to each word line 47 and each bit line 49 to selectively read (e.g. detect the presence of a stored charge) each source charge trapping region 62 and each drain charge trapping region 64 of each memory cell 48 within at least one active column 48 to reproduce the data originally stored therein.

It is recognized that the presence of trapped electrons within a source charge trapping region 62 or a drain charge trapping region 64 effect depletion within the channel region 50 below such charge trapping regions. As such, the presence of trapped electrons in either the source charge trapping region 62 or the drain charge trapping region 64 effect the threshold voltage of a field effect transistor (FET) characterized by the control gate 60, a bit line diffusion 49 that functions as a source region, and a bit line diffusion 49 that functions as a drain region. Therefore, each bit of the dual bit memory cell 48 may be "read", or more specifically, the presence of electrons stored within each of the source charge trapping region 62 and the drain charge trapping region 64 may be detected by operation of the FET.

In particular, the presence of electrons stored within a source charge trapping region 62 may be detected by applying a positive voltage to the control gate 60 and a lesser positive voltage to the bit line that functions as the drain region while the bit line that functions as the source region is grounded. The current flow is then measured at the bit line that functions as the drain region. Assuming proper voltages and thresholds for measurement (and assuming no current leakage from adjacent memory cells 48 within the same row as the selected cell 48 and assuming no current leakage from memory cells 48 within the same column as the selected cell 48) if there are electrons trapped within the source charge trapping region 62, no current (or at least no current above a threshold) will be measured at the bit line comprising the drain region. Otherwise, if the source charge trapping region 62 is charge neutral (e.g., no trapped electrons) then there will be a measurable current flow into the bit line functioning as the drain region. Similarly, the presence of electrons stored within the drain charge trapping region 64 may be detected by the same method, and merely reversing the bit line functioning as the source region and the bit line functioning as the drain region.

Recognizing that current leakage from adjacent memory cells 48 in inactive columns 45 and adjacent to the selected cell may affect accurate reading, the teachings of this invention provide for assuring that such memory cells in such inactive columns are not subject to leakage due to over-erasure.

Although this invention has been shown and described with respect to certain preferred embodiments, it is obvious that equivalents and modifications will occur to others skilled in the art upon the reading and understanding of the specification. For example, Although the cells of the array are shown as a substantially planar structure formed on the silicon substrate, it should be appreciated that the teachings of this invention may be applied to both planar, fin formed, and other charge trapping dielectric flash memory cell structures which may be formed on suitable semiconductor substrates which include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention includes all such equivalents and modifications, and is limited only by the scope of the following claims.

What is claimed is:

1. A method of storing a data pattern and reproducing the data pattern within an array of non-volatile memory cells, the array comprising a first active column of memory cells adjacent to, and sharing a bit line with, a first inactive column of memory cells, the method comprising:

storing a charge within a selected plurality of the memory cells within the first active column, the selected plurality of memory cells representing a portion of the input data pattern;

determining an inactive memory cell programming pattern, the inactive memory cell programming pattern identifying a selected plurality of the memory cells in the first inactive column in which a charge is to be stored for the purpose of periodically storing a charge in the memory cells within the first inactive column to prevent over erasure;

storing a charge on the selected plurality of the memory cells in the first inactive column;

reproducing the portion of the input data pattern by reading each memory cell within the first active column;

coupling all memory cells in both the active column of memory cells and the inactive column of memory cells to voltage potentials that provide for removing a stored charge.

2. The method of claim 1, wherein the inactive memory cell programming pattern is a pattern that provides for storing a charge on all of the memory cells within the first inactive column.

3. The method of claim 1, wherein the inactive memory cell programming pattern is a pattern sequentially selected from a plurality of inactive programming patterns, the plurality of inactive programming patterns, in sequence, providing for storing a charge on each memory cell within the first inactive column at least once prior to performing a predetermined number of sequential erase cycles.

4. The method of claim 1, wherein:

the first inactive column is within a continuous block of inactive columns, the continuous block further comprising a second inactive column of memory cells adjacent to, and sharing a bit line with, a second active column of memory cells; and at least one additional inactive column of memory cells between the first inactive column and the second inactive column;

the inactive memory cell programming pattern further identifying a selected plurality of the memory cells within the second inactive column in which a charge is to be stored for the purpose of periodically storing a charge in the memory cells within the second inactive column to prevent over erasure;

the method further comprising:

storing a charge within a selected plurality of the memory cells within the second active column, the selected plurality of memory cells representing a second portion of the input data pattern;

storing a charge on the selected plurality of the memory cells within the second inactive column;

reproducing the second portion of the input data pattern by reading each memory cell within the second active column; and and wherein the step of coupling all memory cells in both the first active column and the first inactive column to voltage potentials that provide for removing a stored charge further comprises simultaneously coupling all memory cells in the second active column, the second inactive column, and the at least one additional column to the voltage potentials.

5. The method of claim 4, wherein the inactive programming pattern is a pattern that provides for storing a charge on all memory cells within the first inactive column and the second inactive column.

6. The method of claim 5, wherein the inactive programming pattern that further provides for storing a charge on at least a portion of the memory cells within the at least one additional inactive column.

7. The method of claim 6, wherein storing a charge on at least a portion of the memory cells within the at least one additional inactive columns is independent of storing a charge on all memory cells with in the first inactive column and the second inactive column.

8. The method of claim 4, wherein the inactive programming pattern is a pattern sequentially selected from a plurality of inactive programming patterns, the plurality of inactive programming patterns, in sequence, providing for storing a charge on each memory cell within the first inactive column and the second inactive column at least once prior to performing a predetermined number of sequential erase cycles.

9. The method of claim 8, wherein the inactive programming pattern further provides for storing a charge on at least a portion of the cells within the at least one additional inactive column.

10. An array of non-volatile memory cells for storing a data pattern and reproducing the data pattern, the array comprising:
a semiconductor substrate;
a plurality of parallel and spaced apart bit line diffusions within the substrate defining a plurality of vertical channel regions spaced there between;
a plurality of parallel spaced apart semiconductor word lines positioned over the substrate and separated from the substrate by an insulator film, a charge storage region, and a second insulator film, the word lines being perpendicular to the bit line diffusions and forming a memory cell at each intersection of a word line and a channel region;
means for determining an inactive memory cell programming pattern, the inactive memory cell programming pattern identifying a selected plurality of the memory cells within a first inactive column that includes those memory cells that are formed by a first single one of the plurality of vertical channel region's intersection with each of the plurality of word lines, in which a charge is to be stored for the purpose of periodically storing a charge in the memory cells within the first inactive column to prevent over erasure;
an array control circuit coupled to each bit line diffusion, coupled to each word line, and comprising:
programming circuits for coupling each bit line diffusion and each word line to programming potentials for:
storing a charge within a selected plurality of memory cells within a first active column that includes those memory cells that are formed by a second single one of the plurality of vertical channel regions, that is adjacent to the first single one of the plurality of vertical channel regions, intersection with each of the plurality of word lines, the selected plurality of memory cells representing a portion of the data pattern; and
storing a charge on the selected plurality of the memory cells in the first inactive column;
reading circuits for coupling each bit line diffusion and each word line to programming potentials for reproducing the portion of the input data pattern by reading each memory cell within the first active column;
erase circuits for coupling all memory cells in both the active column of memory cells and the inactive column of memory cells to erase voltage potentials that provide for removing a stored charge.

11. The array of claim 10, wherein the inactive memory cell programming pattern is a pattern that provides for storing a charge on all of the memory cells within the first inactive column.

12. The array of claim 10, wherein the inactive memory cell programming pattern is a pattern sequentially selected from a plurality of inactive programming patterns, the plurality of inactive programming patterns, in sequence, providing for storing a charge on each memory cell within the first inactive column at least once prior to performing a predetermined number of sequential erase cycles.

13. The array of claim 10, wherein:
the first inactive column is within a continuous block of inactive columns, the continuous block further comprising a second inactive column of memory cells adjacent to a second active column of memory cells; and at least one additional inactive column of memory cells between the first inactive column and the second inactive column;
the inactive memory cell programming pattern further identifying a selected plurality of the memory cells within the second inactive column in which a charge is to be stored for the purpose of periodically storing a charge in the memory cells within the second inactive column to prevent over erasure;
the programming circuits further providing for:
storing a charge within a selected plurality of the memory cells within the second active column, the selected plurality of memory cells representing a second portion of the data pattern;
storing a charge on the selected plurality of the memory cells within the second inactive column;
the reading circuits further providing for reproducing the second portion of the input data pattern by reading each memory cell within the second active column; and
the erase circuits further coupling all memory cells in the second active column, the second inactive column, and the at least one additional column to the erase voltage potentials.

14. The array of claim 13, wherein the inactive programming pattern is a pattern that provides for storing a charge on all memory cells within the first inactive column and the second inactive column.

15. The array of claim 14, wherein the inactive programming pattern that further provides for storing a charge on at least a portion of the memory cells within the at least one additional inactive column.

16. The array of claim 15, wherein storing a charge on at least a portion of the memory cells within the at least one additional inactive columns is independent of storing a charge on all memory cells with in the first inactive column and the second inactive column.

17. The array of claim 13, wherein the inactive programming pattern is a pattern sequentially selected from a plurality of inactive programming patterns, the plurality of inactive programming patterns, in sequence, providing for storing a charge on each memory cell within the first inactive column and the second inactive column at least once prior to performing a predetermined number of sequential erase cycles.

18. The array of claim 17, wherein the inactive programming pattern further provides for storing a charge on at least a portion of the cells within the at least one additional inactive column.

* * * * *